(12) United States Patent
Lu et al.

(10) Patent No.: US 11,094,655 B2
(45) Date of Patent: Aug. 17, 2021

(54) SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Wen-Hsiung Lu, Tainan (TW); Chang-Jung Hsueh, Taipei (TW); Chin-Wei Kang, Tainan (TW); Hui-Min Huang, Taoyuan (TW); Wei-Hung Lin, Xinfeng Township, Hsinchu County (TW); Cheng-Jen Lin, Kaohsiung (TW); Ming-Da Cheng, Taoyuan (TW); Chien-Chun Wang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 103 days.

(21) Appl. No.: 16/439,957

(22) Filed: Jun. 13, 2019

(65) Prior Publication Data
US 2020/0395323 A1 Dec. 17, 2020

(51) Int. Cl.
*H01L 21/768* (2006.01)
*H01L 23/528* (2006.01)
(Continued)

(52) U.S. Cl.
CPC .......... *H01L 24/11* (2013.01); *H01L 21/6835* (2013.01); *H01L 21/76832* (2013.01);
(Continued)

(58) Field of Classification Search
CPC ..... H01L 21/6835; H01L 24/03; H01L 24/11; H01L 24/14; H01L 24/13; H01L 2224/11472; H01L 2224/03914; H01L 2224/13082; H01L 2924/37001; H01L 2224/11001; H01L 2224/0401; H01L 2224/13018; H01L 2224/13017; H01L 2224/0346; H01L 2224/11903; H01L 2224/1403; H01L 2221/68345;
(Continued)

(56) References Cited

U.S. PATENT DOCUMENTS 10,600,688 B2 * 3/2020 Zhang ............... H01L 21/76846
2005/0253179 A1 * 11/2005 Park .................. H01L 27/10852
257/301
(Continued)

*Primary Examiner* — Savitri Mulpuri
(74) *Attorney, Agent, or Firm* — McClure, Qualey & Rodack, LLP

(57) ABSTRACT

A method for forming a semiconductor structure is provided. The method includes forming a seed layer over a substrate and forming a first mask layer over the seed layer. The method also includes forming a first trench and a second trench in the first mask layer and forming a first conductive material in the first trench and the second trench. The method further includes forming a second mask layer in the first trench and over the first conductive material, and forming a second conductive material in the second trench and on the first conductive material. A first conductive connector is formed in the first trench with a first height, a second conductive connector is formed in the second trench with a second height, and the second height is greater than the first height.

20 Claims, 23 Drawing Sheets

(51) Int. Cl.
*H01L 23/00* (2006.01)
*H01L 21/683* (2006.01)

(52) U.S. Cl.
CPC ............ *H01L 23/528* (2013.01); *H01L 24/03* (2013.01); *H01L 24/14* (2013.01); *H01L 2224/03914* (2013.01); *H01L 2224/11903* (2013.01); *H01L 2224/1403* (2013.01); *H01L 2924/37001* (2013.01)

(58) Field of Classification Search
CPC ... H01L 2224/11474; H01L 2224/0345; H01L 2924/00014; H01L 21/76832; H01L 213/528
See application file for complete search history.

(56) References Cited

U.S. PATENT DOCUMENTS

| | | | |
|---|---|---|---|
| 2006/0246733 A1 | 11/2006 | Ahn et al. | |
| 2007/0007656 A1* | 1/2007 | Yoon | H01L 28/91 257/758 |
| 2014/0210087 A1* | 7/2014 | Kang | H01L 23/528 257/751 |
| 2014/0264709 A1* | 9/2014 | Tsai | H01L 21/76879 257/459 |
| 2015/0048512 A1* | 2/2015 | Kang | H01L 23/53295 257/773 |
| 2018/0047665 A1* | 2/2018 | Zhang | H01L 21/76843 |
| 2018/0151422 A1* | 5/2018 | Tsai | H01L 21/76834 |
| 2018/0358262 A1* | 12/2018 | Lu | H01L 21/02126 |

\* cited by examiner

SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting these new packaging technologies, various packages with different or similar functions can be integrated together.

Although existing package structures and methods of fabricating package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
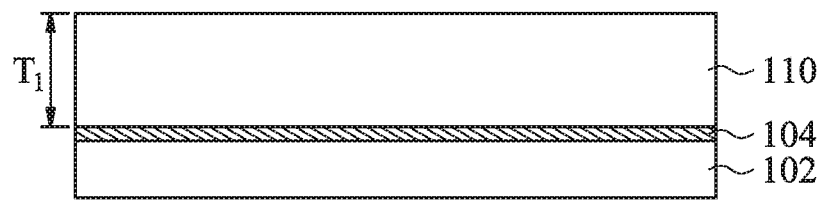
FIGS. 1A-1F show cross-sectional representations of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a package structure and method for forming the same are provided. FIGS. 1A-1F show cross-sectional representations of various stages of forming a semiconductor structure 100a, in accordance with some embodiments of the disclosure.

As shown in FIG. 1A, a first substrate 102 is provided. The first substrate 102 may be made of silicon (Si) or another semiconductor material, such as germanium (Ge). In some embodiments, the first substrate 102 is a substrate of a device die. In some embodiments, the first substrate 102 is made of a compound semiconductor such as silicon carbide, gallium arsenic, indium arsenide, or indium phosphide. In some embodiments, the first substrate 102 is made of semiconductor material, ceramic material, polymer material, metal material, another applicable material or a combination thereof. In some embodiments, the first substrate 102 is a glass substrate. In some embodiments, the first substrate 102 is a semiconductor substrate, such as silicon wafer.

The device elements (not shown) may be formed on the first substrate 102. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements 104, such as deposition, etching, implantation, photolithography, annealing, and/or other applicable processes. In some embodiments, device elements are formed in the substrate 102 in a front-end-of-line (FEOL) process.

The first substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed in or on the first substrate 102, in a P-well structure, in an N-well structure, or in a dual-well structure.

The first substrate 102 may further include isolation features (not shown), such as shallow trench isolation (STI) features or local oxidation of silicon (LOCOS) features. Isolation features may define and isolate various device elements.

Afterwards, a seed layer 104 is formed over the first substrate 102. The seed layer 104 is made of metal material, such as copper (Cu), titanium (Ti), copper alloy, titanium alloy, or a combination thereof. In some embodiments, the seed layer 104 is formed by a deposition process, such as a plating process, a chemical vapor deposition process (CVD), a physical vapor deposition process (PVD), another applicable process, or a combination thereof.

Subsequently, a first mask layer 110 is formed over the seed layer 104. The first mask layer 110 may be made of a photoresist material, silicon, silicon oxide, or silicon nitride. In some embodiments, the first mask layer 110 is formed by a deposition process, such as a chemical vapor deposition (CVD) process or by a spin coating process. The first mask layer 110 has a first thickness $T_1$.

Figure 1B:
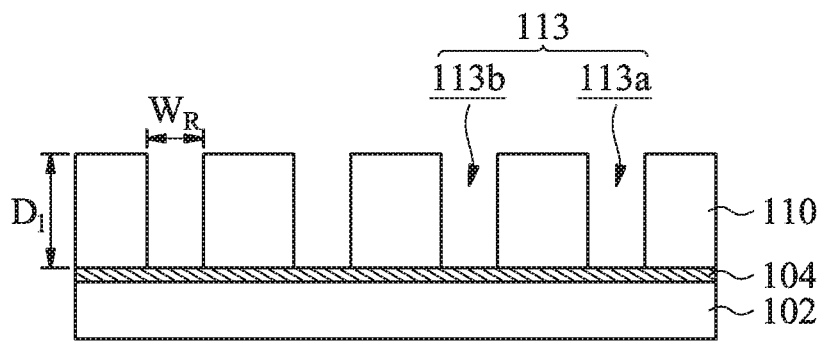

Next, as shown in FIG. 1B, a number of trenches 113 are formed in the first mask layer 110, in accordance with some embodiments of the disclosure. The trenches include a first trench 113a and a second trench 113b. The trenches 113 are formed by a patterning process. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

Each of the trenches 113 has a first depth $D_1$ which is measured from the top surface of the seed layer 104 to the top surface of the first mask layer 110. Each of the trenches 113 has a trench width $W_R$. In some embodiments, an aspect ratio ($D_1/W_R$) of the first depth $D_1$ to the trench width $W_R$ is in a range from about 5 to about 30.

Figure 1C:
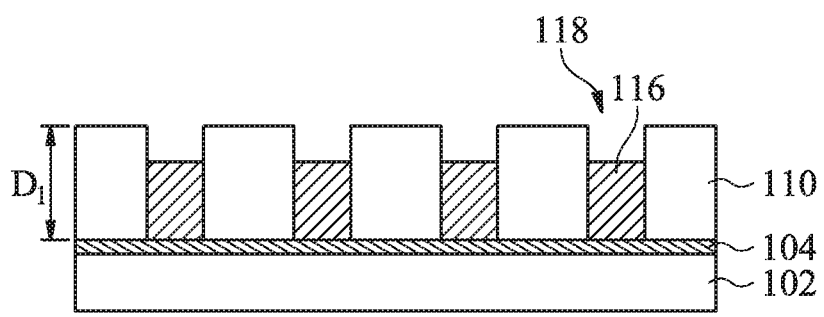

Next, as shown in FIG. 1C, a first conductive material 116 is formed in each of the trenches 113, in accordance with some embodiments of the disclosure. More specifically, the first conductive material 116 is formed in the first trench 113a and the second trench 113b. The first conductive material 116 is formed over the seed layer 104. As a result, a number of first conductive connectors 118 are formed.

In some embodiments, the first conductive material 116 is made of metal material, such as copper (Cu), copper alloy, aluminum (Al), aluminum alloy, tungsten (W), tungsten alloy, titanium (Ti), titanium alloy, tantalum (Ta) or tantalum alloy. In some embodiments, the first conductive material 116 is formed by an electroplating process. In some embodiments, the first conductive material 116 has a planar, concave or convex top surface. The concave or convex topography of the top surface of the first conductive material 116 can be obtained by controlling the concentration, the content, and the temperature of the electroplating solution, and/or controlling the current of the electroplating process.

Figure 1D:
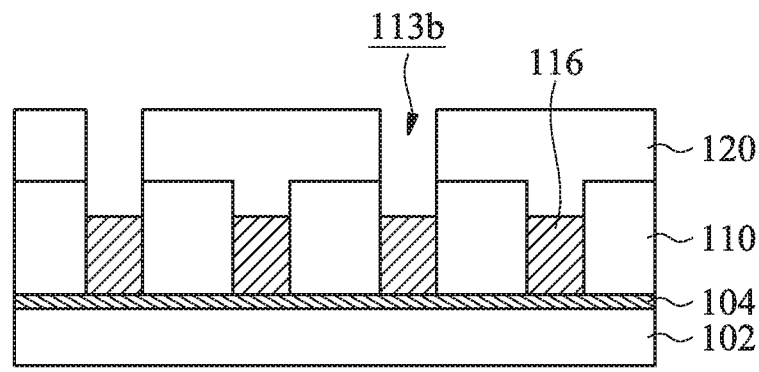

Afterwards, as shown in FIG. 1D, a second mask layer 120 is formed over the first mask layer 110 and in the first trench 113a, in accordance with some embodiments of the disclosure. The second mask layer 120 is formed on a first portion of the first conductive connectors 118, and a second portion of the first conductive connectors 118 is not covered by the second mask layer 120 and therefore are exposed.

The second mask layer 120 may be made of a photoresist material, silicon, silicon oxide, or silicon nitride. In some embodiments, the first mask layer 110 is different from the second mask layer 120, and an interface between the first mask layer 110 and the second mask layer 120. In some embodiments, the second mask layer 120 is formed by a deposition process, such as a chemical vapor deposition (CVD) process or by a spin coating process.

Figure 1E:
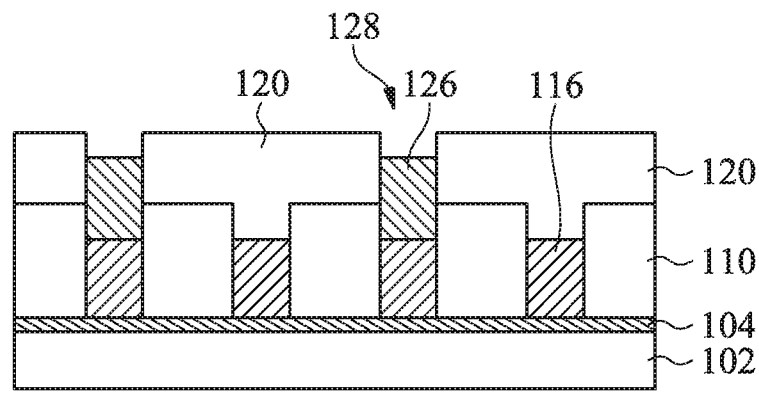

Next, as shown in FIG. 1E, a second conductive material 126 is formed in the second trench 113b and on the first conductor material 116, in accordance with some embodiments of the disclosure. The second conductive material 126 is formed over the exposed portion of the first conductive connectors 118. As a result, a number of second conductive connectors 128 are formed, and each of the second conductive connectors 128 includes the first conductive material 116 and the second conductive material 126.

In some embodiments, the second conductive material 126 is made of metal material, such as copper (Cu), copper alloy, aluminum (Al), aluminum alloy, tungsten (W), tungsten alloy, titanium (Ti), titanium alloy, tantalum (Ta) or tantalum alloy. In some embodiments, the second conductive material 126 is formed by a deposition process, such as an electroplating method. In some embodiments, the second conductive material 126 has a planar, concave or convex top surface.

In some embodiments, the first conductive material 116 and the second conductive material 126 are made of different materials, and an interface 117 is between the first conductive material 116 and the second conductive material 126. In some other embodiments, the first conductive material 116 and the second conductive material 126 are made of the same materials, and the interface 117 is between the first conductive material 116 and the second conductive material 126 due to the top surface of the first conductive material 126 is curved. In some embodiments, the interface 117 can be observed using an electron microscope, such as a scanning electron microscope (SEM), and/or spectroscopy technology, such as an energy-dispersive X-ray spectroscopy (EDS, EDX or XEDS).

Figure 1F:
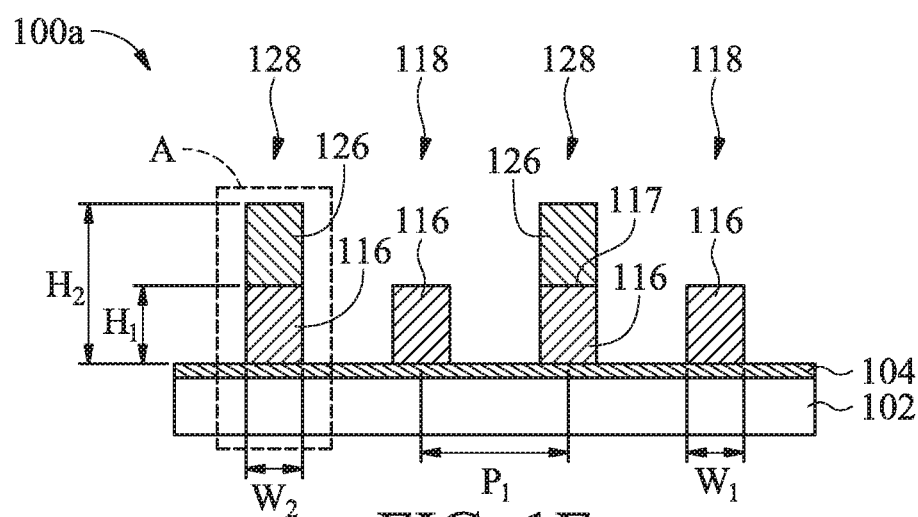

Afterwards, as shown in FIG. 1F, the first mask layer 110 and the second mask 120 are removed, in accordance with some embodiments of the disclosure. As a result, the semiconductor structure 100a is obtained. The semiconductor structure 100a includes the first conductive connector 118 and the second conductive connector 128 with different heights. In some embodiments, the first conductive connectors 118 and the second conductive connectors 128 are alternatively disposed.

There is a first pitch $P_1$ between the first conductive connector 118 and the second conductive connector 128. In some embodiments, the first pitch $P_1$ is in a range from about 2 μm to about 20 μm. Each of the first conductive connectors 118 has a first height $H_1$ and a first width $W_1$. Each of the second conductive connectors 128 has a second height $H_2$ and a second width $W_2$. The second height $H_2$ is greater than the first height $H_1$. A ratio ($H_2-H_1/H_1$) of the difference between the second height $H_2$ and the first height $H_1$ to the first height $H_1$ is greater than 1.

In some embodiments, the first height $H_1$ is in a range from about 15 μm to about 30 μm. In some embodiments, the second height $H_2$ is in a range from about 30 μm to about 60 μm. In some embodiments, the first width $W_1$ is substantially equal to the second $W_2$, and the first width $W_1$ is in a range from about 2 μm to about 10 μm. The aspect ratio ($H_1/W_1$) of the first conductive connector 118 is in range from about 5 to about 14. The aspect ratio ($H_2/W_2$) of the second conductive connector 128 is in a range from about 15 to about 30. If the aspect ratio is greater than 30, void may be formed during the process for forming the first conductive connector 118 since the plating solution is not easily to flow a bottom of the trench 113.

It should be noted that the conductive connectors with mixed height are formed over the first substrate 102. When the first mask layer 110 is made of a photoresist material, the aspect ratio ($D_1/W_1$) of the trench 113 (shown in FIG. 1B) is limited due to the resolution of the photolithography process. If the height of the first mask layer 110 is too large (e.g. the first depth $D_1$ is greater than 18 μm while the first width $W_1$ is 3 μm), the first mask layer 110 may collapse. As a result, the first conductive material 116 is deposited with a limited height when the aspect ratio of the trench 113 is limited. In order to obtain a higher conductive connector and prevent collapse, the second conductive material 126 is deposited over the first conductive material 116. Therefore, the second conductive connector 128 has a higher aspect ratio than the first conductive connector 118.

Furthermore, a high aspect ratio trench is difficult to fill. The second conductive connector 128 is formed by performing the deposition process twice, rather than once. Therefore, it becomes easy to fill the conductive materials. In some embodiments, the deposition processes for forming the first conductive connector 118 and the second conductive connector 128 are performed multiple times to form a predetermined height. Therefore, a semiconductor structure 100b with mixed heights and a fine pitch is obtained.

Figure 2A:
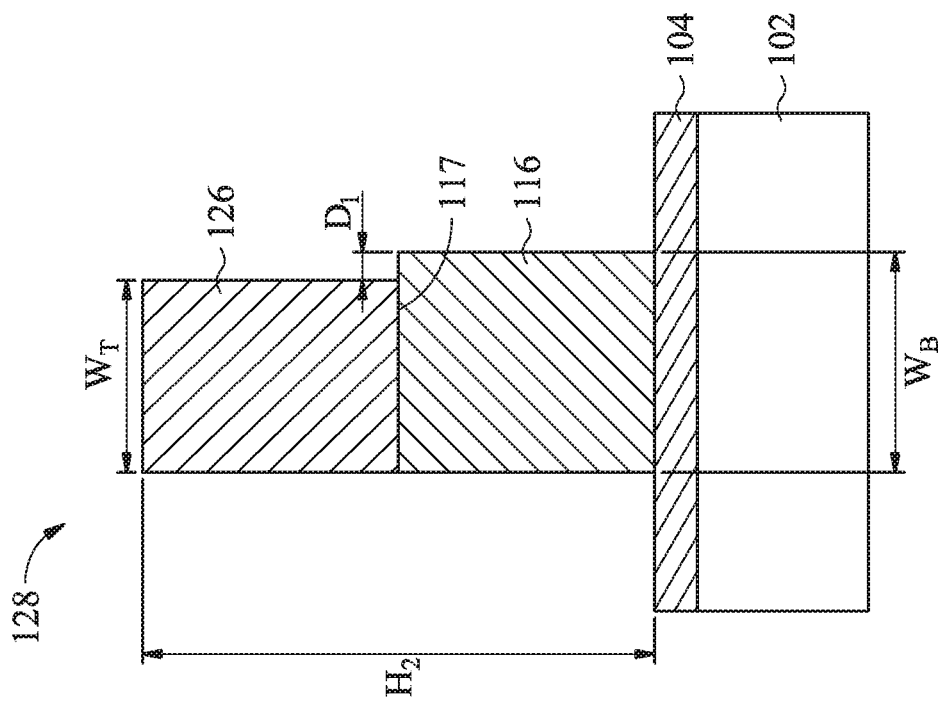
FIGS. 2A-2E show various enlarged cross-sectional representations of region A of FIG. 1F, in accordance with some embodiments of the disclosure.

FIG. 2A shows an enlarged cross-sectional representation of region A of FIG. 1F, in accordance with some embodiments of the disclosure. The second conductive connector 128 has a top portion made of the second conductive material 126 and a bottom portion made of the first conductive material 116. The sidewall surfaces of the top portion are substantially aligned with the sidewall surfaces of the bottom portion. The interface 117 is between the first conductive material 116 and the second conductive material 126.

When the second mask layer 120 is formed on the first mask layer 110 by a patterning process, the unwanted portion of the second mask layer 120 may not be removed completely and remain on edges of the first conductive material 116. Therefore, a recess 127 is formed at the bottom edge of the second conductive material 126 in the second conductive connector 128 when the second mask layer 120 and the first mask layer 110 are removed. The sidewall surfaces of the second conductive material 126 are not aligned with the sidewall surface of the first conductive material 116. The bottom surface of the first conductive material 116 has the bottom width $W_B$, and the top surface of the second conductive material 126 has a top width $W_T$. The bottom width $W_B$ is substantially equal to the top width $W_T$.

FIGS. 2B-2E show various enlarged cross-sectional representations of region A of FIG. 1F, in accordance with some embodiments of the disclosure.

Figure 2B:
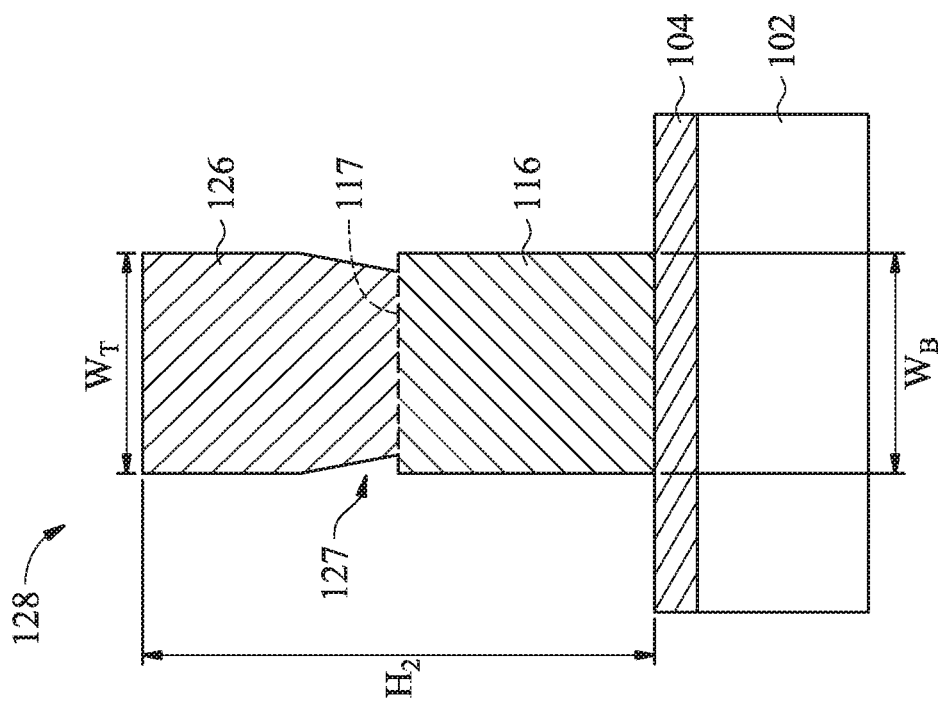

As shown in FIG. 2B, the bottom width $W_B$ of the first conductive material 116 is greater than the top width $W_T$ of the second conductive material 126. The interface 117 between the first conductive material 116 and the second conductive material 126 is substantially planar. The left sidewall surface of the first conductive material 116 is substantially aligned with the left sidewall surface of the second conductive material 126. The right sidewall surface of the first conductive material 116 is not aligned with the right sidewall surface of the second conductive material 126. There is a first distance $D_1$ between the right sidewall surface of the first conductive material 116 and the right sidewall surface of the second conductive material 126. In some embodiments, a ratio ($D_1/W_B$) of the first distance $D_1$ to the bottom width $W_B$ is in a range from about 1% to about 10%.

Figure 2C:
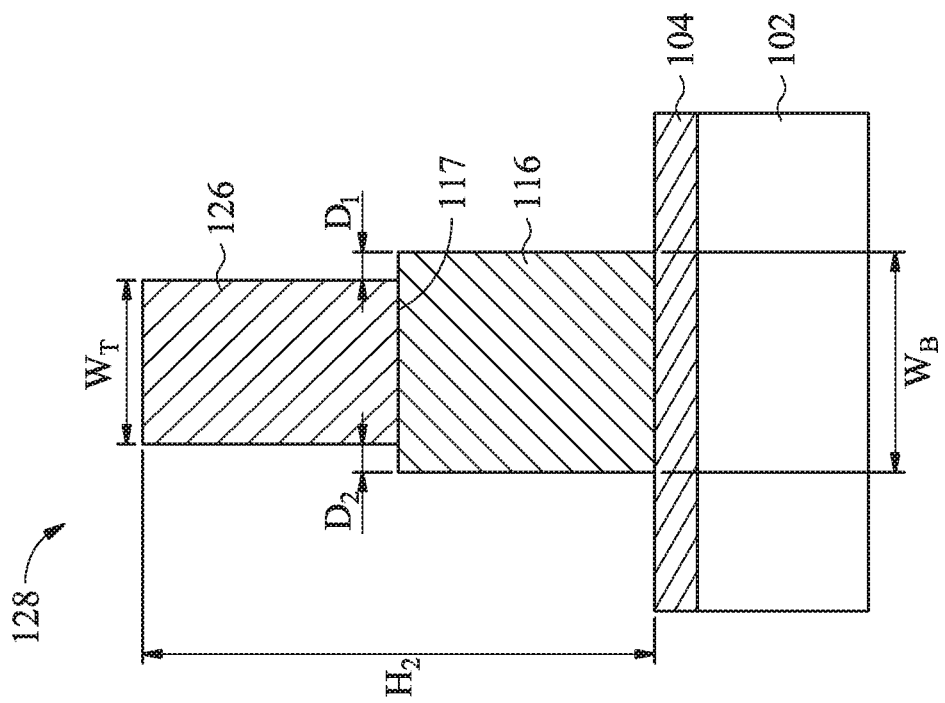

As shown in FIG. 2C, the first conductive material 116 has a curved top surface, and the sidewall surfaces of the first conductive material 116 are not aligned with the sidewall surfaces of the second conductive material 126. The interface 117 between the first conductive material 116 and the second conductive material 126 is curved.

The bottom width $W_B$ of the first conductive material 116 is greater than the top width $W_T$ of the second conductive material 126. In some embodiments, there is a first distance $D_1$ between the right sidewall surface of the first conductive material 116 and the right sidewall surface of the second conductive material 126. In some embodiments, there is a second distance $D_2$ between the left sidewall surface of the first conductive material 116 and the left sidewall surface of the second conductive material 126. In some embodiments, a ratio ($D_1/W_B$) of the first distance $D_1$ to the bottom width $W_B$ is in a range from about 1% to about 10%. In some embodiments, a ratio ($D_2/W_B$) of the second distance $D_2$ to the bottom width $W_B$ is in a range from about 1% to about 10%.

Figure 2D:
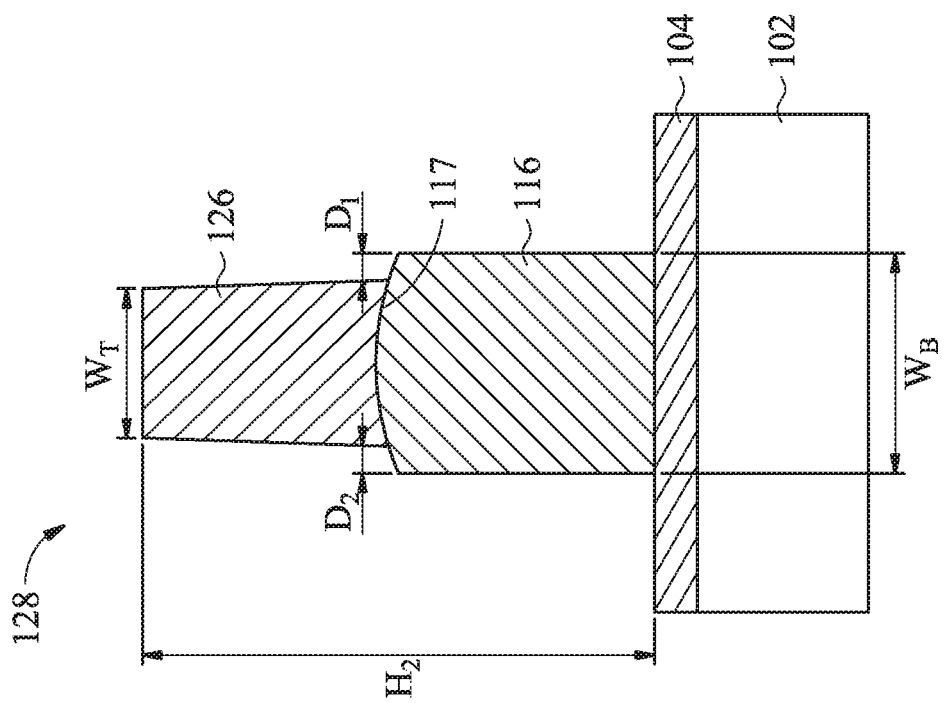

As shown in FIG. 2D, similar to FIG. 2C, the sidewall surfaces of the first conductive material 116 are not aligned with the sidewall surfaces of the second conductive material 126.

Figure 2E:
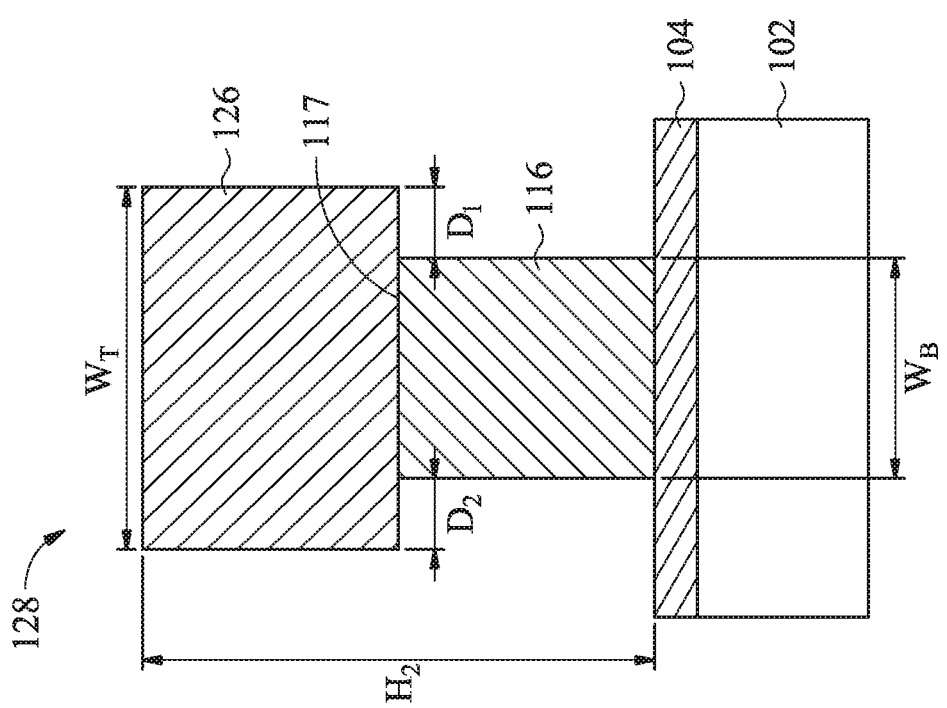

As shown in FIG. 2E, the bottom width $W_B$ of the bottom surface of the first conductive material 116 is smaller than the top width $W_T$ of the top surface of the second conductive material 126.

FIGS. 3A-3H show cross-sectional representations of various stages of forming a semiconductor structure 100b, in accordance with some embodiments of the disclosure.

Figure 3A:
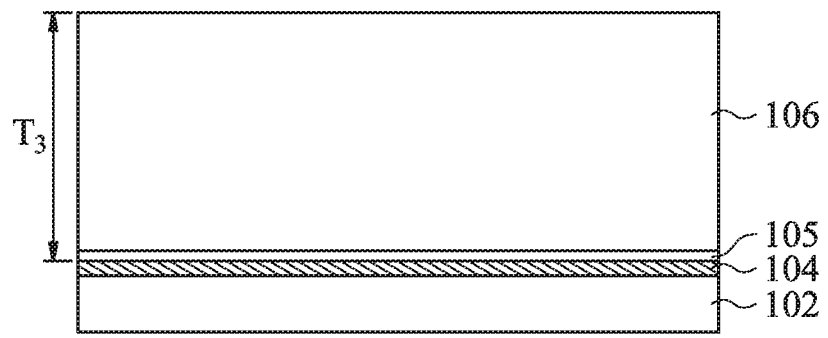
FIGS. 3A-3H show cross-sectional representations of various stages of forming a semiconductor structure, in accordance with some embodiments of the disclosure.

The semiconductor structure 100b is similar to, or the same as, the semiconductor structure 100a shown in FIG. 1F, except that a second substrate 106 is bonded to the first substrate 102, and the second substrate 106 in FIG. 3A has the third thickness $T_3$ greater than the first thickness $T_1$ of the first mask layer 110 in FIG. 1A. Processes and materials used to form semiconductor structure 100b may be similar to, or the same as, those used to form the semiconductor structure 100a and are not repeated herein.

As shown in FIG. 3A, the seed layer 104 is formed over the first substrate 102, and an oxide layer 105 is formed over the seed layer 104. Afterwards, the second substrate 106 is formed over the oxide layer 105.

The oxide layer 105 may be silicon oxide. The second substrate 106 may be made of silicon (Si) or another semiconductor material, such as germanium (Ge). In some embodiments, the second substrate 106 is a substrate of a device die. In some embodiments, the second substrate 106 is made of a compound semiconductor such as silicon carbide, gallium arsenic, indium arsenide, or indium phosphide.

The second substrate 106 is bonded to the oxide layer 105 by performing a fusion bonding process. The fusion bonding may be silicon-silicon oxide fusion bonding.

In some embodiments, the fusion bonding process is operated at a pressure in a range from about 2N to about 10 KN. In some embodiments, the fusion bonding process is operated at a temperature in a range from about 25 degrees Celsius to about 300 degrees Celsius.

The second substrate 106 has a third thickness $T_3$. In some embodiments, the third thickness $T_3$ is in a range from about 500 to about 800 μm.

Figure 3B:
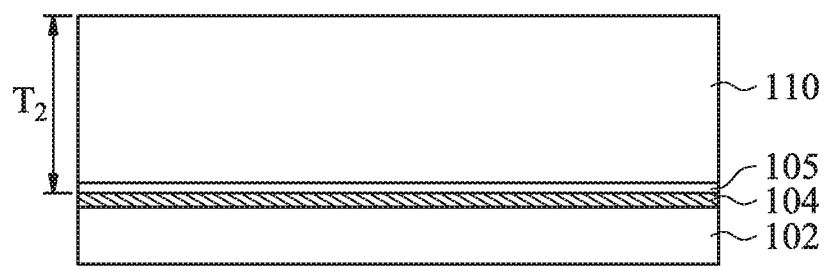

Next, as shown in FIG. 3B, a portion of the second substrate 106 is removed to form the first mask layer 110, in accordance with some embodiments of the disclosure. The thickness of the second substrate 106 is reduced from the third thickness $T_3$ to the second thickness $T_2$. In some embodiments, the second thickness $T_2$ of the first mask layer 110 is in a range from about 40 μm to about 100 μm.

Figure 3C:
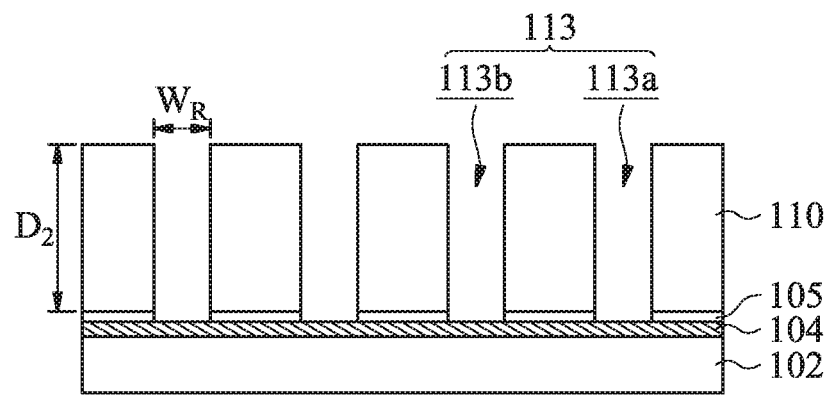

Afterwards, as shown in FIG. 3C, a number of trenches 113 are formed in the first mask layer 110, in accordance with some embodiments of the disclosure. The trenches 113 are formed by a patterning process. The trenches 113 include the first trench 113a and the second trench 113b. A portion of the first mask layer 110 and a portion of the oxide layer 105 are removed to expose the seed layer 104.

Each of the trenches 113 has a second depth $D_2$ which is measured from the top surface of the seed layer 104 to the top surface of the first mask layer 110. Each of the trenches 113 has a trench width $W_R$. In some embodiments, an aspect ratio ($D_2/W_R$) of the second depth $D_2$ to the trench width $W_R$ is in a range from about 5 to about 30.

Since the first mask layer 110 is made of semiconductor material (such as Si), the second depth $D_2$ of the trench 113 in FIG. 3C can be greater than the first depth D1 of the trench 113 in FIG. 1B. Therefore, the high aspect ratio trench 113 in FIG. 3C can be obtained.

Figure 3D:
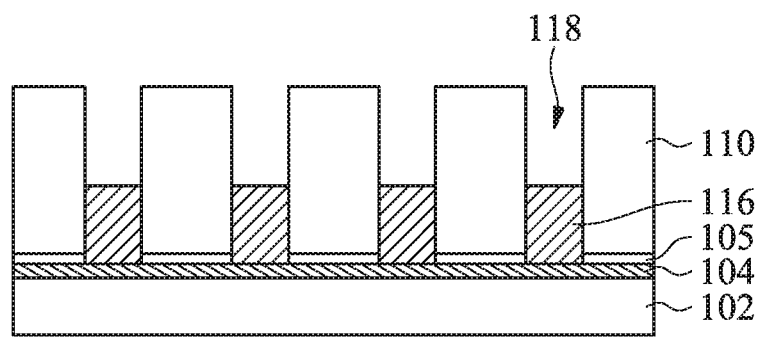

Next, as shown in FIG. 3D, the first conductive material 116 is formed in each of the trenches 113, in accordance with some embodiments of the disclosure. The first conductive material 116 is formed in the first trench 113a and the second trench 113b. The first conductive material 116 is formed over the seed layer 104. As a result, a number of first conductive connectors 118 are formed.

Figure 3E:
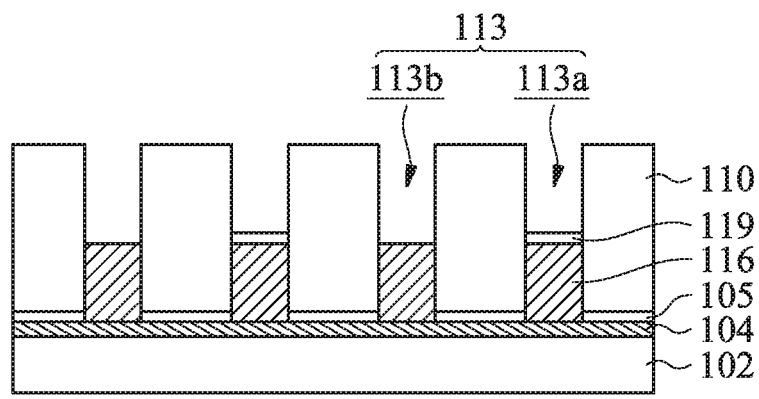

Afterwards, as shown in FIG. 3E, a photoresist layer 119 is formed in the first trench 113a and over the first conductive material 116, in accordance with some embodiments of the disclosure. It should be noted that a portion of the first conductive connectors 118 is not covered by the photoresist layer 119 and therefore are exposed. The top surface of the photoresist layer 119 is lower than the top surface of the first mask layer 110. In some embodiments, the thickness of the photoresist layer 119 is in a range from about 3 µm to about 8 µm.

Figure 3F:
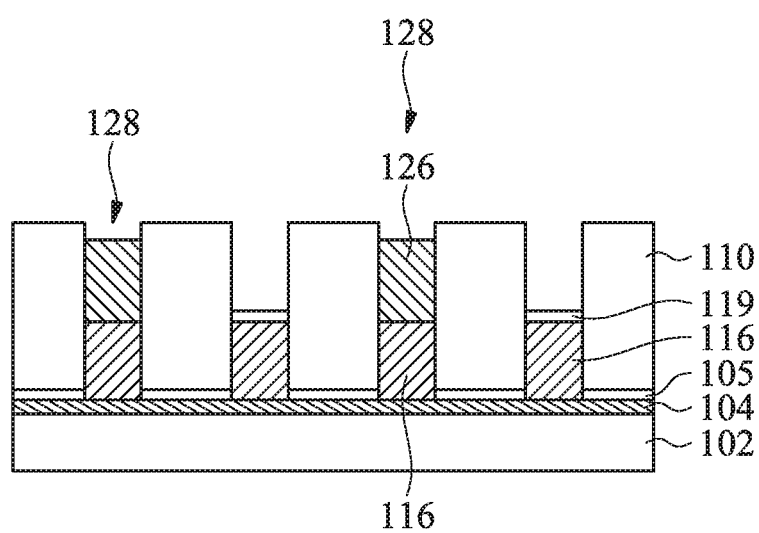

Subsequently, as shown in FIG. 3F, the second conductive material 126 is formed in the second trench 113b and over the first conductive material 116, in accordance with some embodiments of the disclosure. As a result, a number of second conductive connectors 128 are formed, and each of the second conductive connectors 128 includes the first conductive material 116 and the second conductive material 126.

Figure 3G:
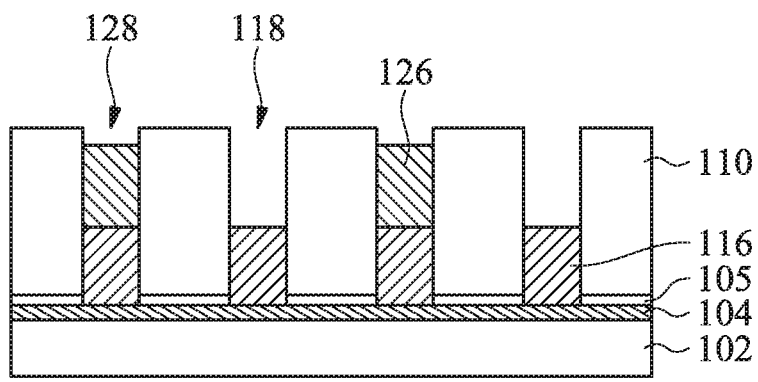

Next, as shown in FIG. 3G, the photoresist layer 119 is removed, in accordance with some embodiments of the disclosure. In some embodiments, the photoresist layer 119 is removed by an etching process, such as a dry etching process.

Figure 3H:
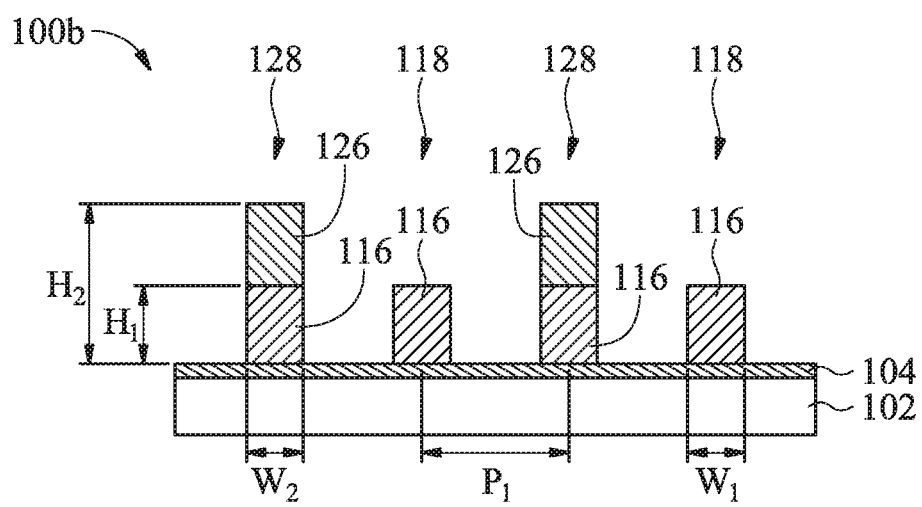

Afterwards, as shown in FIG. 3H, the first mask layer 110 is removed, in accordance with some embodiments of the disclosure. As a result, the semiconductor structure 100b is obtained. The semiconductor structure 100b includes the first conductive connector 118 and the second conductive connector 128 with different heights. The second conductive connector 128 has a second height $H_2$, and the first conductive connector 118 has a first height $H_1$. The second height $H_2$ is greater than the first height $H_1$.

In some embodiments, the first height $H_1$ is in a range from about 15 µm to about 40 µm. In some embodiments, the second height $H_2$ is in a range from about 40 µm to about 60 µm. The aspect ratio ($H_1/W_1$) of the first conductive connector 118 is in a range from about 5 to about 14. The aspect ratio ($H_2/W_2$) of the second conductive connector 128 is in a range from about 14 to about 20.

It should be noted that, as mentioned above, when the first mask layer 110 is made of semiconductor material, such as Si, the first mask layer 110 will not collapse and the high aspect ratio of the trench 113 can be obtained. Therefore, the first conductive connector 118 is formed to have a high aspect ratio and a fine pitch. In addition, by performing multiple deposition processes, the second conductive connector 128 may have a higher aspect ratio than the first conductive connector 118, and it becomes easy to fill the second conductive material 126. Therefore, the yield of the semiconductor structure 100b is improved.

FIGS. 4A-4D show cross-sectional representations of various stages of forming a semiconductor structure 100c, in accordance with some embodiments of the disclosure.

Figure 4A:
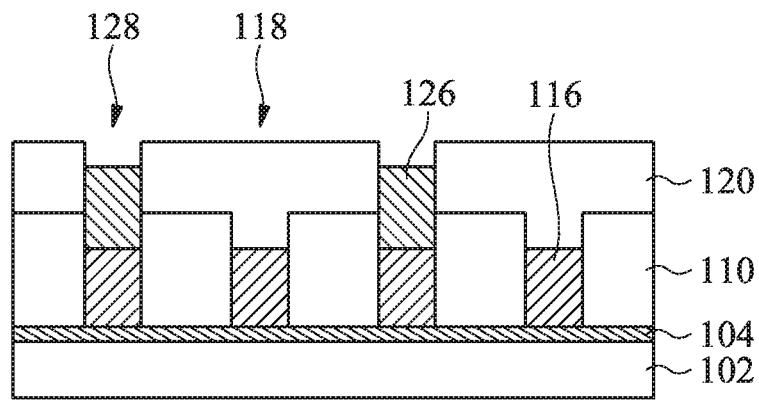
FIGS. 4A-4D show cross-sectional representations of various stages of forming a semiconductor structure, in accordance with some embodiments of the disclosure.

As shown in FIG. 4A, the second conductive material 126 is formed over a portion of the first conductive material 116. The second conductive connector 128 is formed and includes the second conductive material 126 over the first conductive material 116.

Figure 4B:
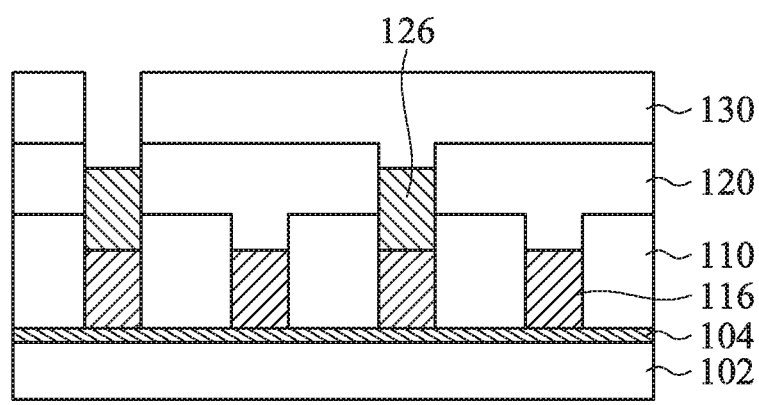

Afterwards, as shown in FIG. 4B, a third mask layer 130 is formed over the second mask layer 120 and a first portion of the second conductive connector 128, in accordance with some embodiments of the disclosure. In addition, a second portion of the second conductive connector 118 is exposed.

Figure 4C:
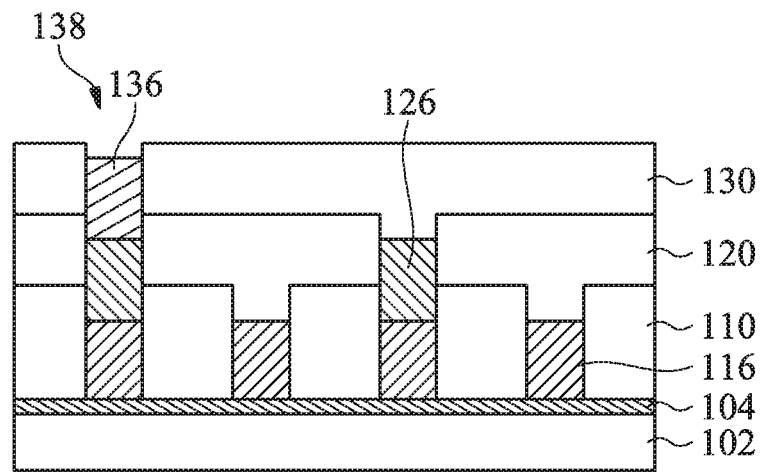

Next, as shown in FIG. 4C, a third conductive material 136 is formed over the second portion of the second conductive connector 118, in accordance with some embodiments of the disclosure. Therefore, a third conductive connector 138 is formed and includes the third conductive material 136, the second conductive material 126 and the first conductive material 116.

Figure 4D:
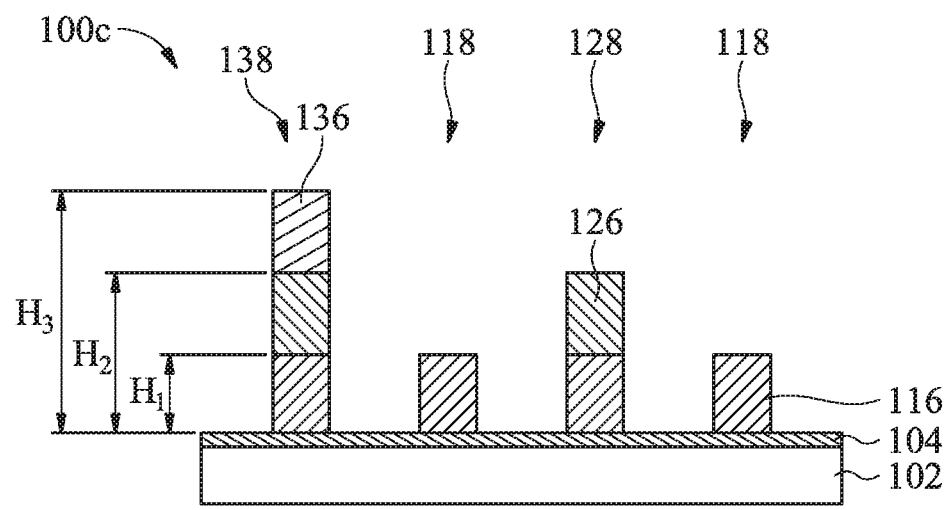

Subsequently, as shown in FIG. 4D, the third mask layer 130, the second mask layer 120 and the first mask layer 110 are removed, in accordance with some embodiments of the disclosure. As a result, the semiconductor structure 100c is obtained. The semiconductor structure 100c includes the first conductive connector 118, the second conductive connector 128, and the third conductive connector 138 with different heights. The third conductive connector 138 has a third height $H_3$. The third height $H_3$ is greater than the second height $H_2$, and the second height $H_2$ is greater than the first height $H_1$.

Figure 5A:
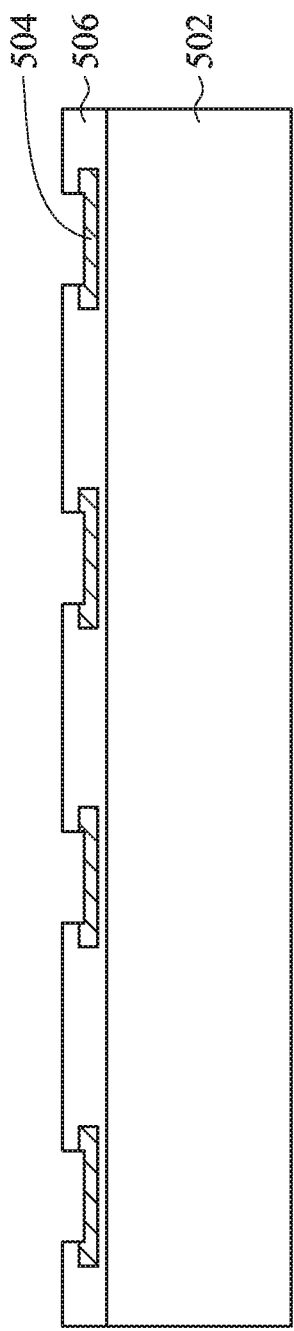
FIGS. 5A-5O show cross-sectional representations of various stages of forming a semiconductor structure, in accordance with some embodiments of the disclosure.
Figure 5B:
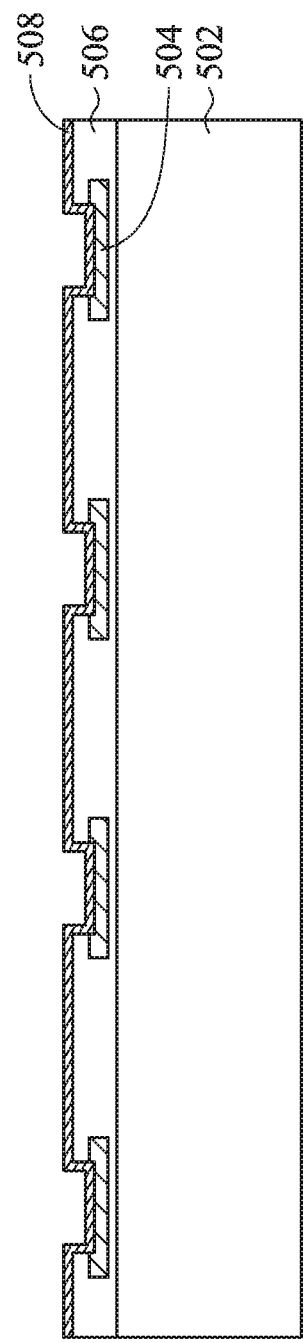
Figure 5C:
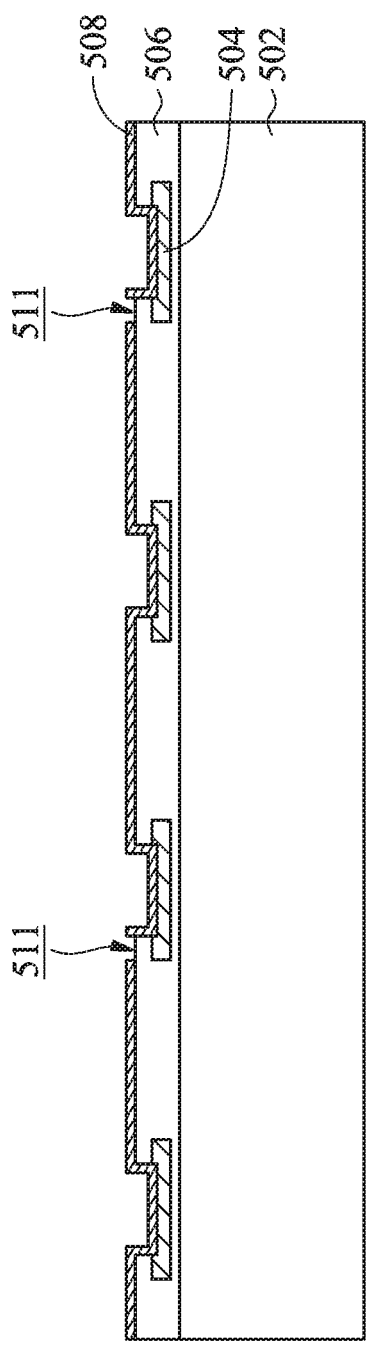
Figure 5D:
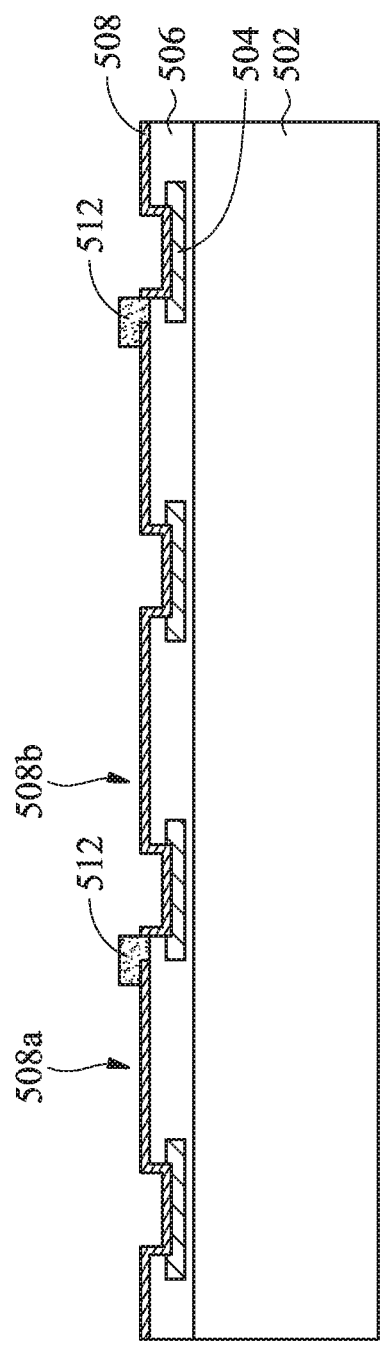
Figure 5E:
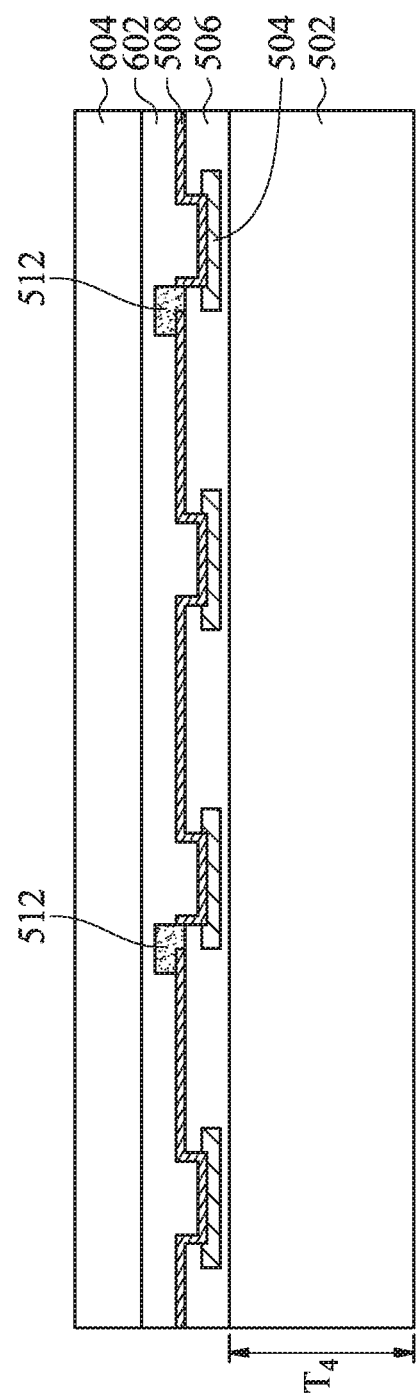
Figure 5F:
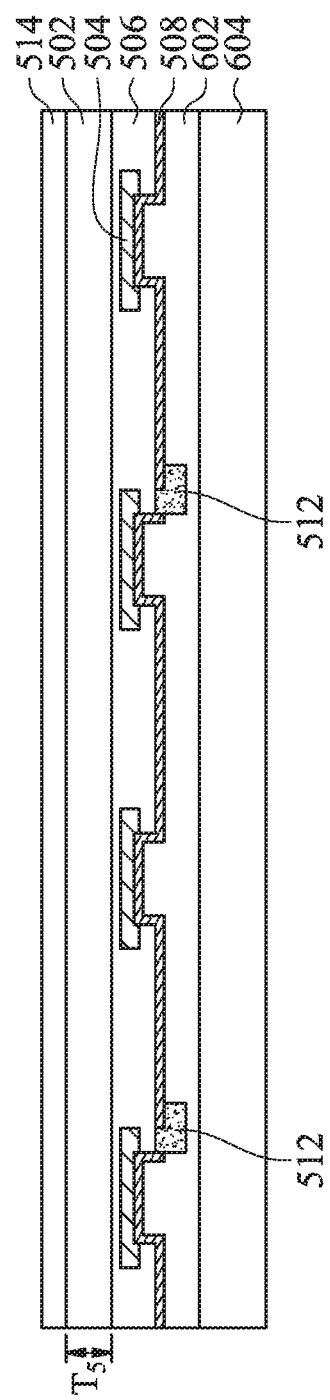
Figure 5G:
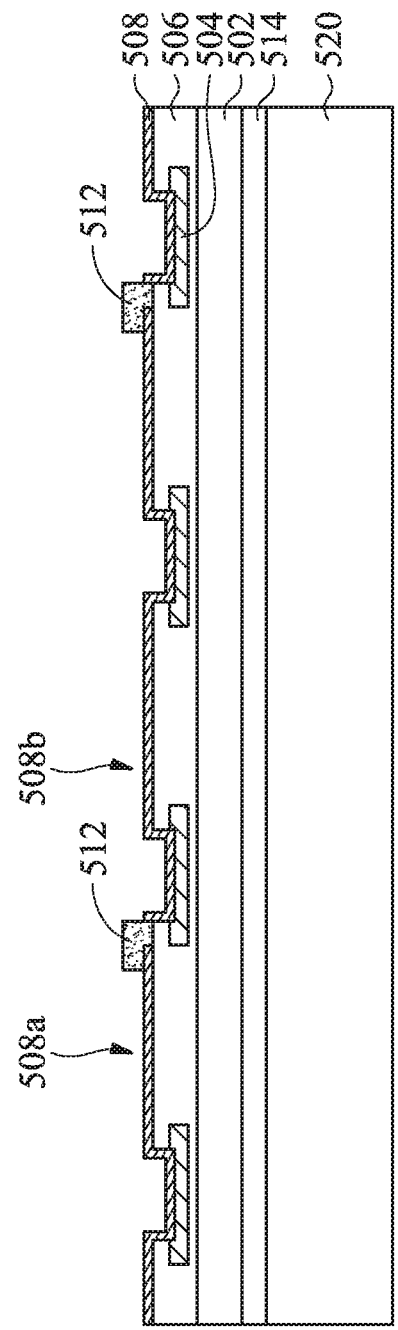
Figure 5H:
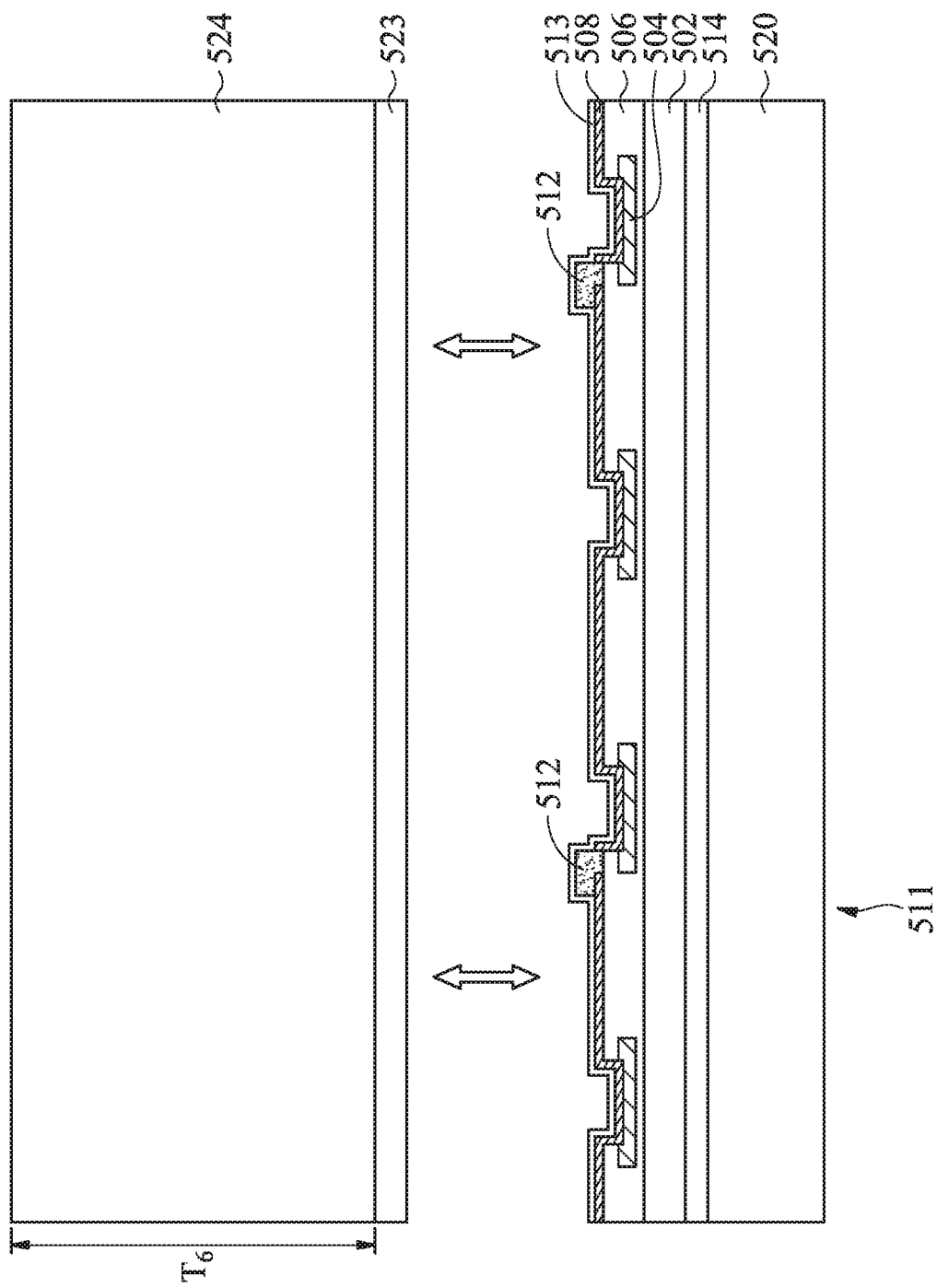
Figure 5I:
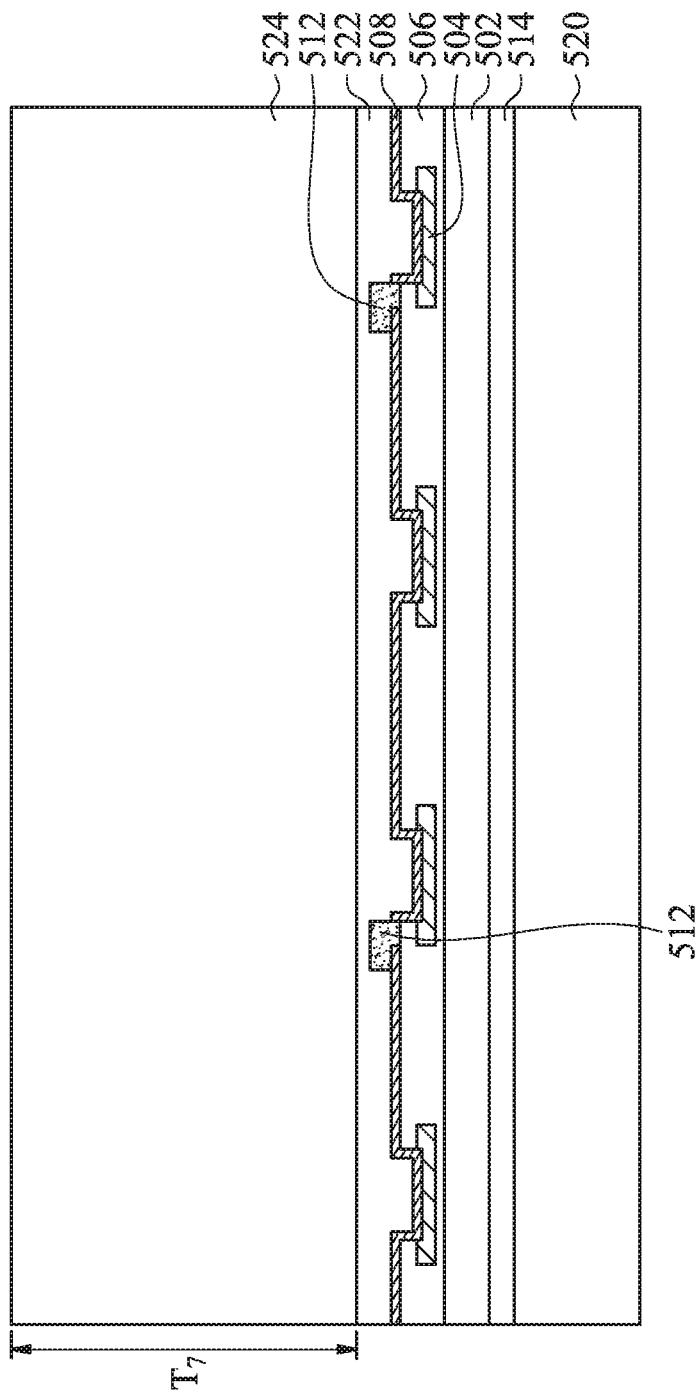
Figure 5J:
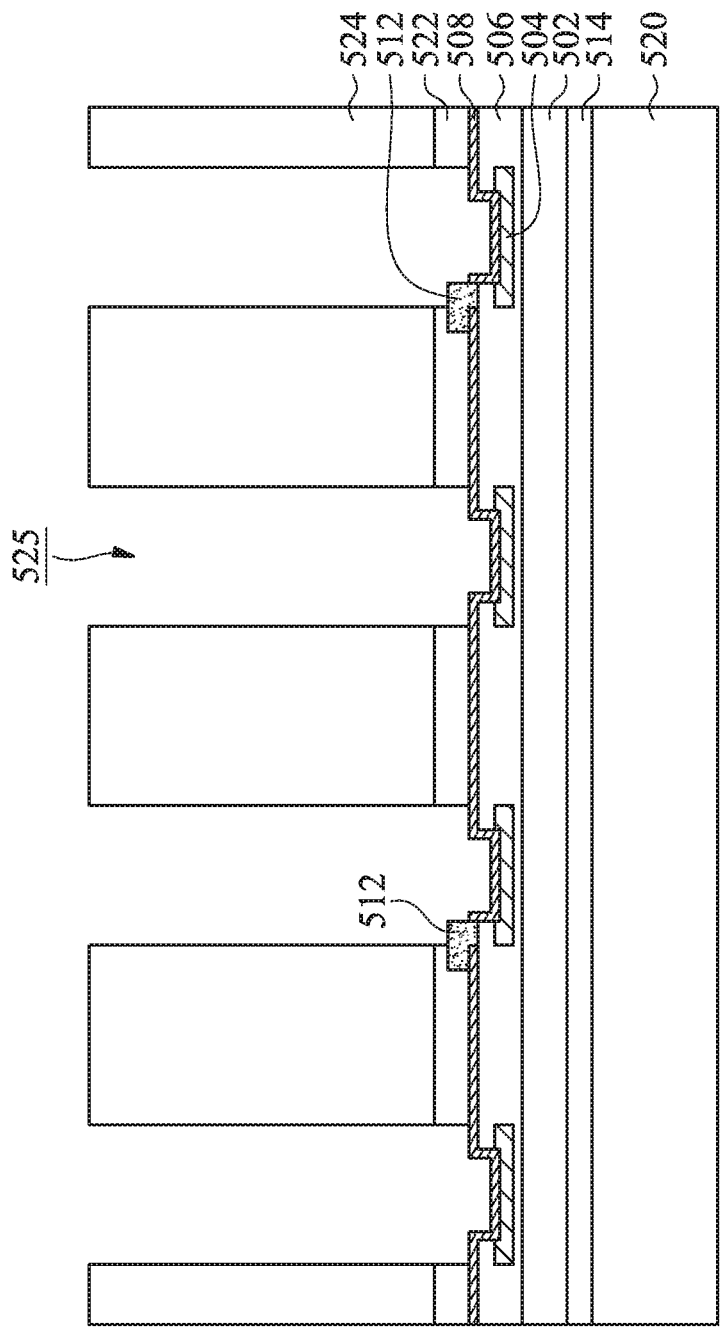
Figure 5K:
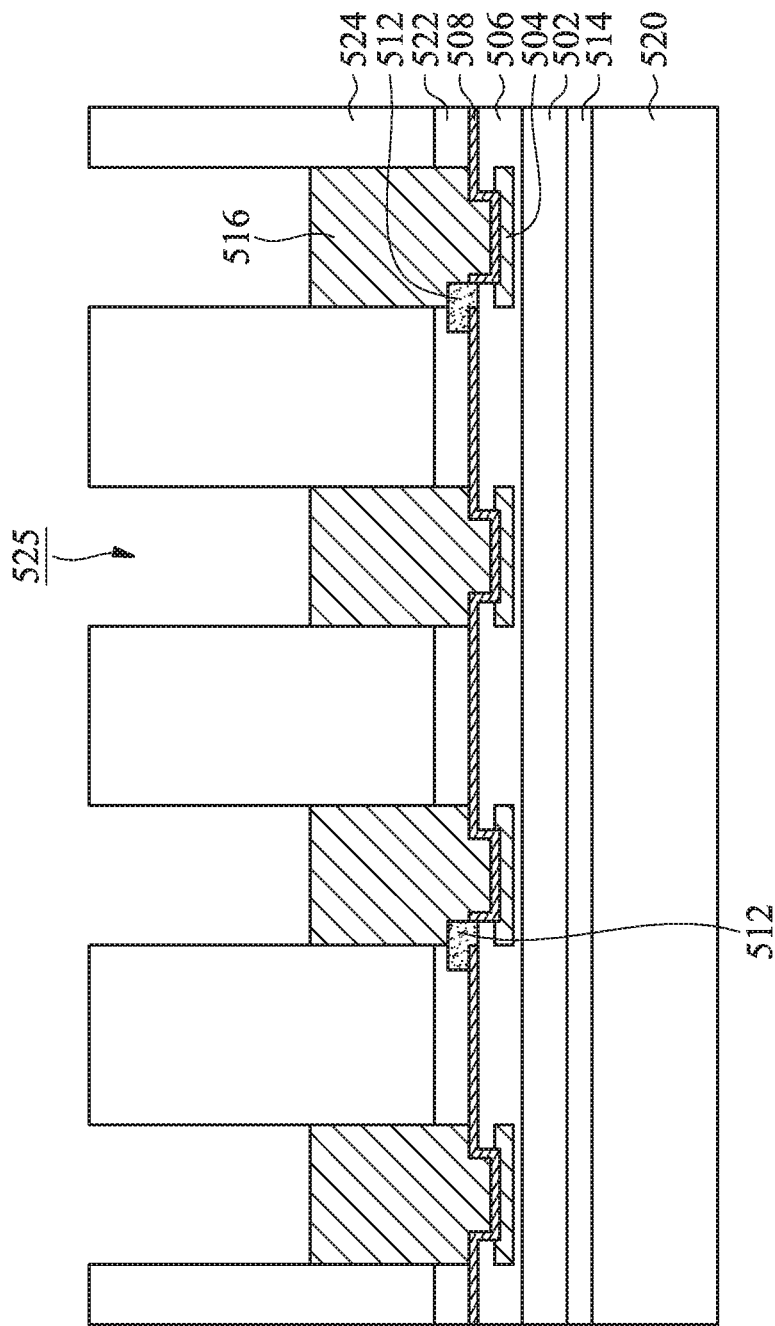
Figure 5L:
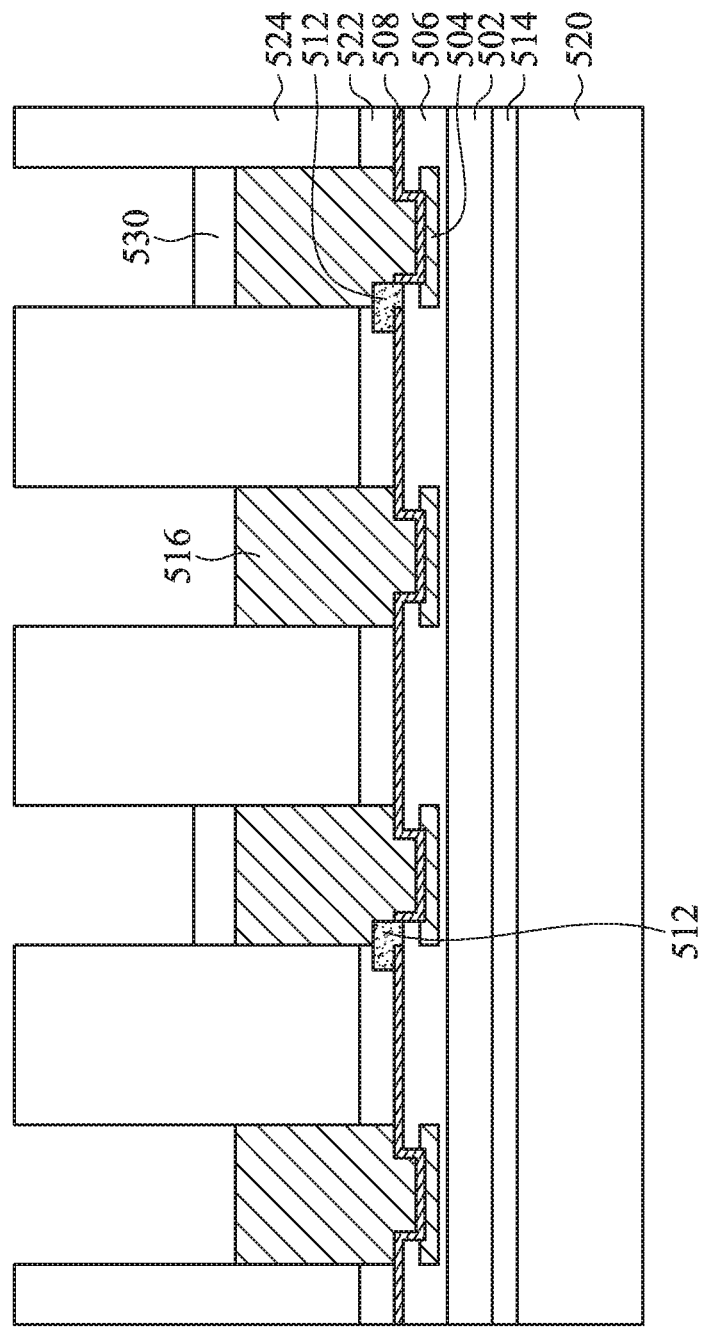
Figure 5M:
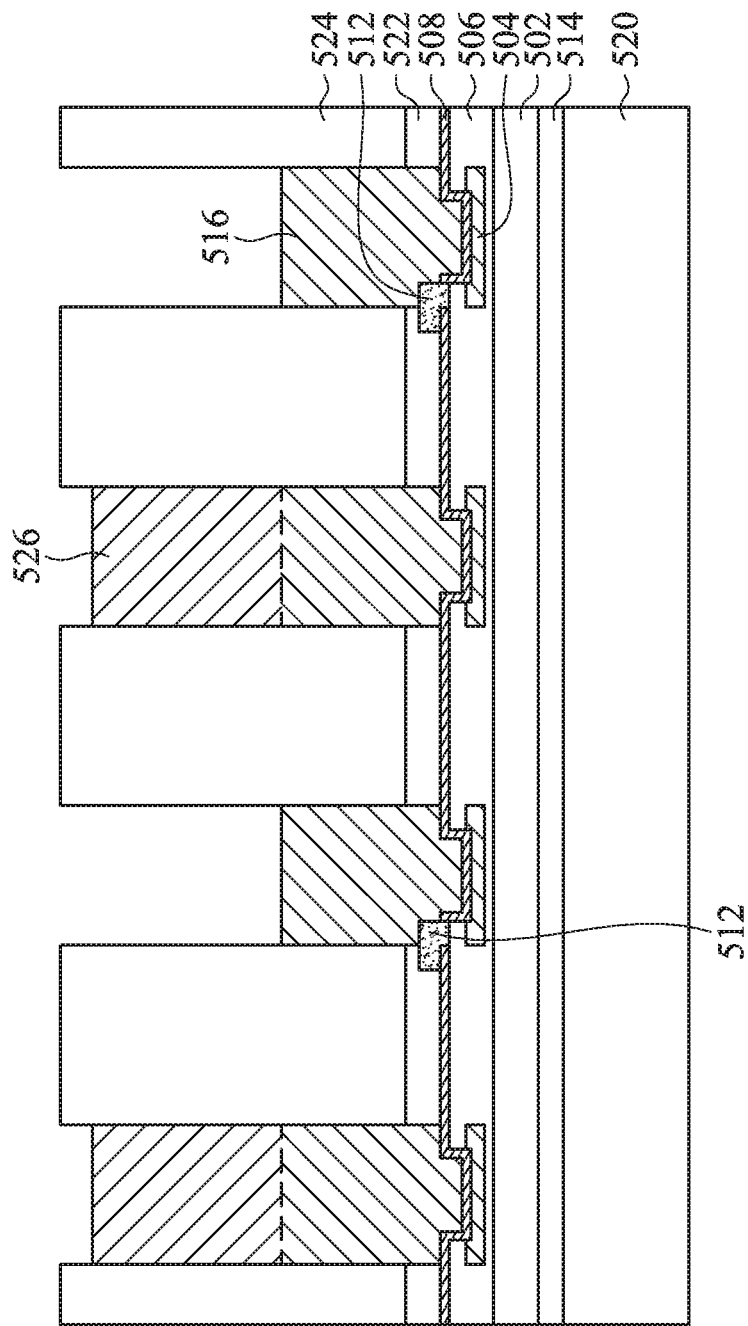
Figure 5N:
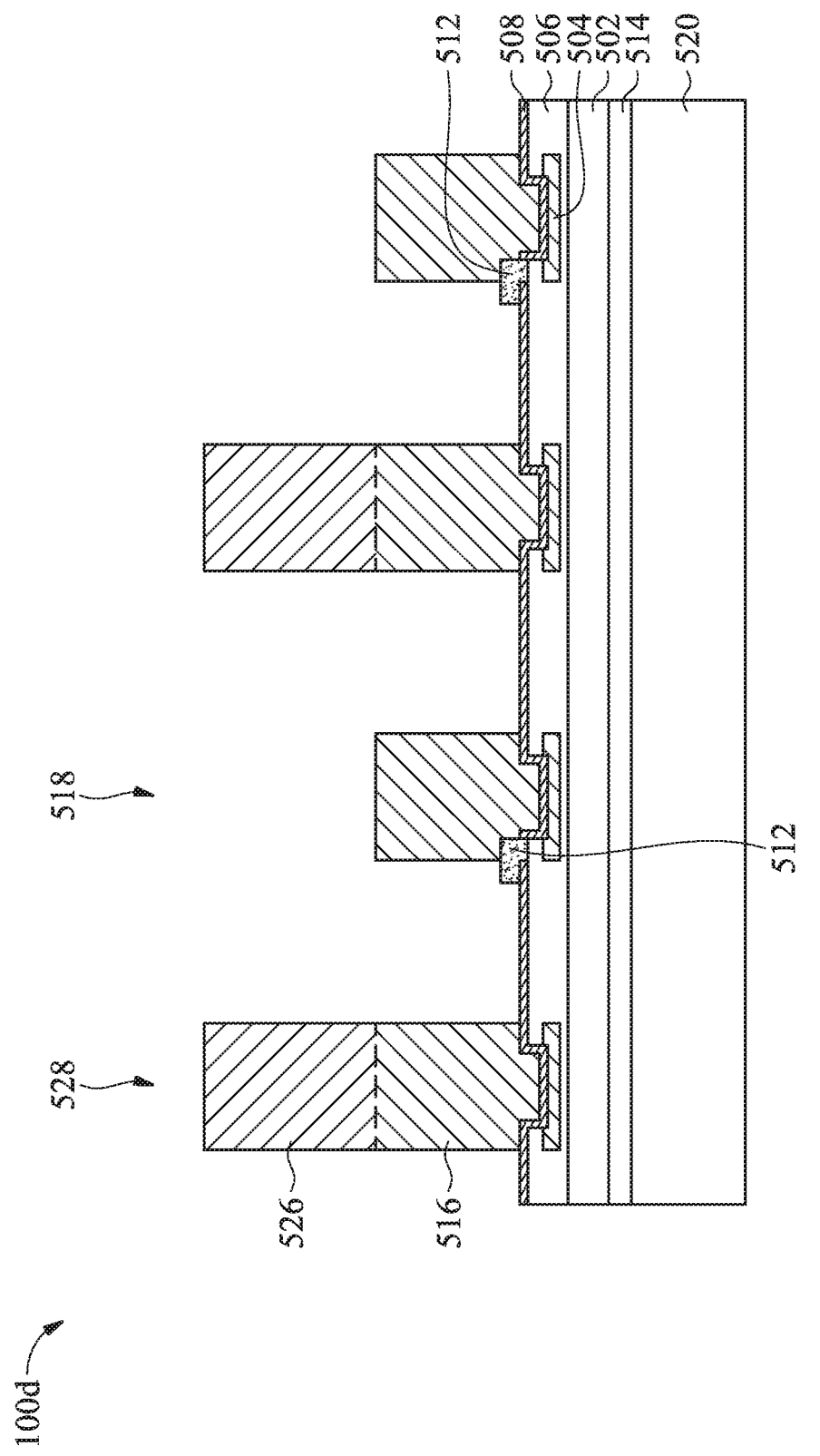
Figure 5O:
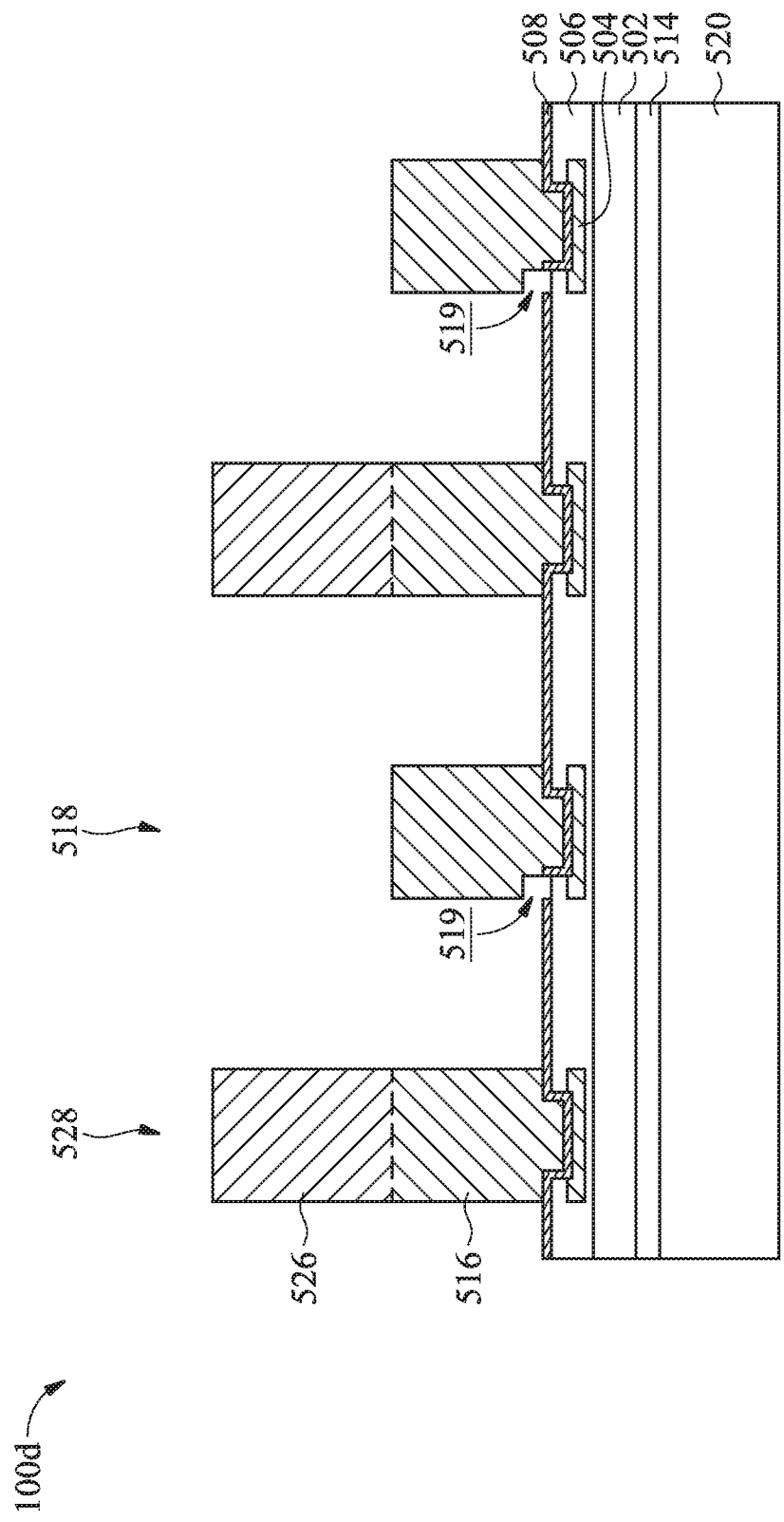

FIGS. 5A-5O show cross-sectional representations of various stages of forming a semiconductor structure 100d, in accordance with some embodiments of the disclosure. The conductive connectors with different height are applied to a micro-electro-mechanical (MEMS) structure.

As shown in FIG. 5A, a conductive pad 504 is formed over a first substrate 502. A passivation layer 506 is formed over the conductive pad 504, and the passivation layer 506 is patterned to expose a portion of the conductive pad 504.

The first substrate 502 may be made of silicon (Si) or another semiconductor material, such as germanium (Ge). In some embodiments, the first substrate 502 is a substrate of a device die. In some embodiments, the first substrate 502 is made of a compound semiconductor such as silicon carbide, gallium arsenic, indium arsenide, or indium phosphide.

In some embodiments, the conductive pad 504 is made of copper (Cu), copper alloy, aluminum (Al), aluminum alloy, tungsten (W), tungsten alloy, titanium (Ti), titanium alloy, tantalum (Ta) or tantalum alloy. In some embodiments, the passivation layer 506 is made of PBO, BCB, silicone, acrylates, siloxane, another suitable material, or a combination thereof. In some other embodiments, the passivation layer 506 is made of non-organic materials. The non-organic materials includes silicon oxide, un-doped silicate glass, silicon oxynitride, SR, silicon nitride, silicon carbide, HMDS, another suitable material, or a combination thereof.

Next, as shown in FIG. 5B, a first seed layer 508 is formed on the passivation layer 506, and on the conductive pad 504, in accordance with some embodiments of the disclosure.

The first seed layer 508 is made of metal material, such as copper (Cu), titanium (Ti), copper alloy, titanium alloy, or a combination thereof. In some embodiments, the first seed layer 508 is formed by a deposition process, such as chemical vapor deposition process (CVD), physical vapor deposition process (PVD), another applicable process, or a combination thereof.

Afterwards, as shown in FIG. 5C, a portion of the seed layer 508 is removed to form a void 511, in accordance with some embodiments of the disclosure. The seed layer 508 is divided into a first portion 508a and a second portion 508b due to formation of the void 511.

Next, as shown in FIG. 5D, a nitride layer 512 is formed over the first seed layer 508 and in the void 511. Next, the nitride layer 512 is patterned to form the patterned nitride layer 512. The nitride layer 512 protrudes from the top surface of the first seed layer 508.

Afterwards, as shown in FIG. 5E, a first carrier substrate 604 is bonded to the first substrate 502 by a first glue layer 602, in accordance with some embodiments of the disclosure. The first glue layer 602 is formed over the first seed layer 508 and the patterned nitride layer 512. The first glue layer 602 is between the first seed layer 508 and the first carrier substrate 604.

The first carrier substrate 604 is used as a temporary substrate. The first carrier substrate 604 provides mechanical and structural support during subsequent processing steps, such as those described in more detail later. The first carrier substrate 604 is made of a semiconductor material, ceramic material, polymer material, metal material, another suitable material, or a combination thereof. In some embodiments, the first carrier substrate 604 is a glass substrate. In some other embodiments, the first carrier substrate 604 is a semiconductor substrate, such as a silicon wafer.

Afterwards, as shown in FIG. 5F, the first carrier substrate 604 is turned upside down and thinned, and a second oxide layer 514 is formed over the first substrate 102, in accordance with some embodiments of the disclosure.

In some embodiments, the second oxide layer 514 is made of silicon oxide. The first substrate 502 is reduced from the fourth thickness $T_4$ to the fifth thickness $T_5$. In some embodiments, the first substrate 502 is thinned by a planarizing process, such as a grinding process, a chemical mechanical polishing (CMP) process, an etching process, another applicable process, or a combination thereof. In some embodiments, the fifth thickness $T_5$ of the first substrate 502 is in a range from about 40 μm to about 60 μm.

Afterwards, as shown in FIG. 5G, a second substrate 520 is formed over the second oxide layer 514, in accordance with some embodiments of the disclosure. Next, the first glue layer 602 and the first carrier substrate 604 are removed. Afterwards, the first substrate 502 is turned upside down. The second substrate 520 is bonded to the second oxide layer 514 by a fusion bonding process.

The second substrate 520 may be made of silicon (Si) or another semiconductor material, such as germanium (Ge). In some embodiments, the second substrate 520 is a substrate of a device die. In some embodiments, the second substrate 520 is made of a compound semiconductor such as silicon carbide, gallium arsenic, indium arsenide, or indium phosphide.

Afterwards, as shown in FIG. 5H, a first mask layer 524 with an oxide material 523 is disposed above the first substrate 502, in accordance with some embodiments of the disclosure. Another oxide material 513 is formed over the first seed layer 508. In some embodiments, the first mask layer 524 is made of made of a photoresist material, silicon, silicon oxide, or silicon nitride.

Afterwards, as shown in FIG. 5I, the first mask layer 524 is bonded to the first substrate 502 by bonding the oxide material 523 and the oxide material 513, in accordance with some embodiments of the disclosure. As a result, a third oxide layer 522 is formed between the first mask layer 524 and the first substrate 102. More specifically, the third oxide layer 522 is between the first mask layer 524 and the first seed layer 108. After the first mask layer 524 is bonded to the first substrate 502, the first mask layer 524 is thinned from the sixth thickness $T_6$ to the seventh thickness $T_7$.

Afterwards, as shown in FIG. 5J, a portion of the first mask layer 524 and a portion of the third oxide layer 522 are removed to form a number of trenches 525, in accordance with some embodiments of the disclosure. Therefore, a portion of the first seed layer 508 and a portion of the nitride layer 512 are exposed by the trenches 525.

Afterwards, as shown in FIG. 5K, a first conductive material 516 is formed in the trenches 525, in accordance with some embodiments of the disclosure. In some embodiments, the first conductive material 516 is made of metal material, such as copper (Cu), copper alloy, aluminum (Al), aluminum alloy, tungsten (W), tungsten alloy, titanium (Ti), titanium alloy, tantalum (Ta) or tantalum alloy.

Afterwards, as shown in FIG. 5L, a second mask layer 530 is formed over a portion of the first conductive material 516, in accordance with some embodiments of the disclosure. In some embodiments, the second mask layer 530 is made of a photoresist material.

Subsequently, as shown in FIG. 5M, a second conductive material 526 is formed over a portion of the first conductive material 516 which is not covered by the second mask layer 530, in accordance with some embodiments of the disclosure. Next, the second mask layer 530 is removed.

Afterwards, as shown in FIG. 5N, the first mask layer 524 and the third oxide layer 522 are removed, in accordance with some embodiments of the disclosure. The semiconductor structure 110d is formed and includes the first conductive connector 518 and the second conductive connector 528. The first conductive connector 518 made of the first conductive material 516 and the second conductive connector 528 made of the first conductive material 516 and the second conductive material 526 are formed.

Afterwards, as shown in FIG. 5O, the nitride layer 512 is removed to form a recess 519, in accordance with some embodiments of the disclosure.

The recess 519 is formed at the bottom portion of the first conductive connector 518. The recess 519 is used to prevent electron charging. The first conductive connector 518 and the second conductive connector 528 are electrically connected to corresponding conductive pads 504.

The second height $H_2$ of the first conductive connector 528 is greater than the first height $H_1$ of the first conductive connector 518. In addition, the first conductive connector 518 has a first width $W_1$, and the second conductor connector 528 has a second width $W_2$. In some embodiments, the first width $W_1$ is substantially equal to the second width $W_2$. In some embodiments, the first height $H_1$ is in a range from about 15 μm to about 35 μm. In some embodiments, the second height $H_2$ is in a range from about 35 μm to about 60 μm. In some embodiments, the aspect ratio ($H_1/W_1$) of the first conductive connector 518 is in a range from about 5 to about 11. In some embodiments, the aspect ratio ($H_2/W_2$) of the second conductive connector 528 is in a range from about 11 to about 20.

It should be noted that the aspect ratio of the trench 525 (shown in FIG. 5K) is not limited to the resolution of photolithography process when the material of the first mask layer 524 is made of a semiconductor material (such as Si), and a high aspect ratio trench 525 is obtained. In addition, by using the semiconductor material as the first mask layer 524, the problem of the first mask layer 524 collapsing can be prevented. Furthermore, by performing the deposition process several times, it becomes easy to fill the conductive materials 516, 526 into the trenches 525. As a result, the first conductive connector 518 and the second conductive connector 528 respectively have a high aspect ratio and a fine pitch. Therefore, the yield of the semiconductor structure is improved.

Embodiments for forming a semiconductor structure and method for forming the same are provided. The semiconductor structure includes conductive connectors having different heights. A number of trenches are formed in a first mask layer. A first conductive material is formed in the trenches to form a number of first conductive connectors. A second mask layer is formed on a first portion of the first conductive connectors, and a second conductive material is formed on a second portion of the first conductive connectors. The second conductive connector is constructed by the first conductive material and the second conductive material. Therefore, a first conductive connector with a first height and a second conductive connector with a second height are obtained. By choosing the materials of the first mask layer and performing the deposition process several times, collapse of the first mask layer is prevented. The conductive connectors have a high aspect ratio and a fine pitch. Therefore, the yield of the semiconductor structure is improved.

In some embodiments, a method for forming a semiconductor structure is provided. The method includes forming a plurality of conductive pads over a first substrate. The method further includes forming a first mask layer over the first substrate and the conductive pads, and forming a plurality of trenches in the first mask layer. The method includes forming a first conductive material in the trenches and over the conductive pads to form a plurality of first conductive connectors. The method further includes forming a second conductive material on a first portion of the first conductive connectors to form a plurality of second conductive connectors. Each of the first conductive connectors has a first height, each of the second conductive connectors has a second height, and the second height is greater than the first height.

In some embodiments, a method for forming a semiconductor structure is provided. The method includes forming a seed layer over a substrate and forming a first mask layer over the seed layer. The method also includes forming a first trench and a second trench in the first mask layer and forming a first conductive material in the first trench and the second trench. The method further includes forming a second mask layer in the first trench and over the first conductive material, and forming a second conductive material in the second trench and on the first conductive material. A first conductive connector is formed in the first trench with a first height, a second conductive connector is formed in the second trench with a second height, and the second height is greater than the first height. The second conductive connector has a bottom portion and a top portion, and the sidewall surface of the bottom portion is not aligned with the sidewall surface of the top portion.

In some embodiments, a method for forming a semiconductor structure is provided. The method includes forming a seed layer over a first substrate, and removing a portion of the seed layer to a void. The method also includes forming a nitride layer in the void, and forming a first mask layer over the nitride layer and the seed layer. The method further includes forming a plurality of trenches in the first mask layer, and forming a first conductive material in the trenches and over the seed layer to form a plurality of first conductive connectors. The method includes forming a second conductive material on a first portion of the first conductive connectors to form a plurality of second conductive connectors, wherein each of the first conductive connectors has a first height, each of the second conductive connectors has a second height, and the second height is greater than the first height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a plurality of conductive pads over a first substrate;
    bonding a second substrate to the first substrate;
    forming a first mask layer over the first substrate and the conductive pads;
    forming a plurality of trenches in the first mask layer;
    forming a first conductive material in the trenches and over the conductive pads to form a plurality of first conductive connectors; and
    forming a second conductive material on a first portion of the first conductive connectors to form a plurality of second conductive connectors, wherein each of the first conductive connectors has a first height, each of the second conductive connectors has a second height, and the second height is greater than the first height.

2. The method for forming the semiconductor structure as claimed in claim 1, further comprising:
    a seed layer formed on the conductive pads, wherein the first conductive material is formed on the seed layer.

3. The method for forming the semiconductor structure as claimed in claim 1, further comprising:
    forming a second mask layer to cover a second portion of the first conductive connectors when forming the second conductive material on the first portion of the first conductive connectors, wherein the second mask layer is different from the first mask layer.

4. The method for forming the semiconductor structure as claimed in claim 1, further comprising:
    removing a portion of the first substrate before bonding the second substrate to the first substrate.

5. The method for forming the semiconductor structure as claimed in claim 1, wherein bonding the second substrate to the first substrate comprises:
    forming an oxide layer over the first substrate; and
    bonding the second substrate to the oxide layer.

6. The method for forming the semiconductor structure as claimed in claim 1, wherein forming the first mask layer over the first substrate comprises:
    forming a first oxide material over the first substrate;
    forming a second oxide material over the first mask layer; and
    bonding the first mask layer over the first substrate by bonding the first oxide material and the second oxide material.

7. The method for forming the semiconductor structure as claimed in claim 6, further comprising:

thinning the first mask layer after bonding the first mask layer over the first substrate.

8. The method for forming the semiconductor structure as claimed in claim 1, further comprising:
forming a nitride layer over a portion of the conductive pads, wherein the nitride layer is below the first conductive connectors;
removing the nitride to form a recess, wherein the recess is formed at a bottom portion of the first conductive connector.

9. A method for forming a semiconductor structure, comprising:
forming a seed layer over a first substrate;
forming a first mask layer over the seed layer;
forming a first trench and a second trench in the first mask layer;
forming a first conductive material in the first trench and the second trench;
forming a second mask layer in the first trench and over the first conductive material;
forming a second conductive material in the second trench and on the first conductive material, wherein a first conductive connector is formed in the first trench with a first height, a second conductive connector is formed in the second trench with a second height, the second height is greater than the first height, the second conductive connector has a bottom portion and a top portion, and a sidewall surface of the bottom portion is not aligned with a sidewall surface of the top portion.

10. The method for forming the semiconductor structure as claimed in claim 9, wherein the first mask layer is made of a photoresist material, silicon, silicon oxide, or silicon nitride.

11. The method for forming the semiconductor structure as claimed in claim 9, wherein forming the first mask layer over the seed layer comprises:
bonding a second substrate over the seed layer, wherein the second substrate is made of silicon; and
removing a portion of the second substrate to form the first mask layer.

12. The method for forming the semiconductor structure as claimed in claim 9, wherein the second conductive connector has an aspect ratio in a range from about 15 to about 20.

13. The method for forming the semiconductor structure as claimed in claim 9, further comprising:
forming a third conductive material on the second conductive connector to form a third conductive connector, wherein the third conductive connector has a third height, and the third height is greater than the second height.

14. The method for forming the semiconductor structure as claimed in claim 9, wherein the first conductive material and the second conductive material are made of different materials, and there is an interface between the first conductive material and the second conductive material.

15. The method for forming the semiconductor structure as claimed in claim 9, wherein a recess is formed at a bottom edge of the second conductive material in the second conductive connector.

16. A method for forming a semiconductor structure, comprising:
forming a seed layer over a first substrate;
removing a portion of the seed layer to form a void;
forming a nitride layer in the void;
forming a first mask layer over the nitride layer and the seed layer;
forming a plurality of trenches in the first mask layer;
forming a first conductive material in the trenches and over the seed layer to form a plurality of first conductive connectors; and
forming a second conductive material on a first portion of the first conductive connectors to form a plurality of second conductive connectors, wherein each of the first conductive connectors has a first height, each of the second conductive connectors has a second height, and the second height is greater than the first height.

17. The method for forming the semiconductor structure as claimed in claim 16, further comprising:
removing the nitride layer to form a recess, wherein the recess is formed at a bottom portion of the first conductive connector.

18. The method for forming the semiconductor structure as claimed in claim 16, wherein forming the first mask layer over the first substrate comprises:
forming a first oxide material over the first substrate;
forming a second oxide material over the first mask layer; and
bonding the first mask layer over the first substrate by bonding the first oxide material and the second oxide material.

19. The method for forming the semiconductor structure as claimed in claim 18, further comprising:
forming a second substrate before bonding the first mask layer over the first substrate; and
thinning a portion of the first mask layer after bonding the first mask layer over the first substrate.

20. The method for forming the semiconductor structure as claimed in claim 9, further comprising:
forming an oxide layer on the seed layer, wherein the first mask layer is formed on the oxide layer.

* * * * *